US006998206B2

(12) United States Patent
Fuller et al.

(10) Patent No.: US 6,998,206 B2
(45) Date of Patent: Feb. 14, 2006

(54) METHOD OF INCREASING THE SHELF LIFE OF A BLANK PHOTOMASK SUBSTRATE

(75) Inventors: Scott Fuller, Portland, OR (US); Melvin W. Montgomery, Camas, WA (US); Jeffrey A. Albelo, Hillsboro, OR (US); Alex Buxbaum, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/758,827

(22) Filed: Jan. 15, 2004

(65) Prior Publication Data

US 2004/0146790 A1    Jul. 29, 2004

Related U.S. Application Data

(62) Division of application No. 09/912,116, filed on Jul. 23, 2001, now Pat. No. 6,703,169.

(51) Int. Cl.
G03F 9/00 (2006.01)
G03F 7/00 (2006.01)

(52) U.S. Cl. ................. 430/5; 430/327; 430/330; 427/372.2; 427/385.5

(58) Field of Classification Search ................ 430/5, 430/327, 330; 427/372.2, 385.5
See application file for complete search history.

(56) References Cited

U.S. PATENT DOCUMENTS

| 4,102,683 | A |   | 7/1978 | DiPiazza ................. 96/38.4 |
| 4,357,416 | A |   | 11/1982 | Fan ..................... 430/302 |
| 5,234,990 | A |   | 8/1993 | Flaim et al. ............. 524/609 |
| 5,278,010 | A |   | 1/1994 | Day et al. ............... 430/18 |
| 5,554,485 | A |   | 9/1996 | Dichiara et al. .......... 430/271.1 |
| 5,717,612 | A | * | 2/1998 | Capodieci .................. 716/21 |
| 5,723,237 | A |   | 3/1998 | Kobayashi et al. .......... 430/30 |
| 5,879,853 | A |   | 3/1999 | Azuma .................... 430/166 |
| 5,879,863 | A |   | 3/1999 | Azuma et al. ............. 430/322 |
| 5,935,768 | A |   | 8/1999 | Biche et al. ............. 430/401 |
| 5,939,236 | A |   | 8/1999 | Pavelchek et al. ........ 430/273.1 |

(Continued)

FOREIGN PATENT DOCUMENTS

EP    0588087    3/1994

(Continued)

OTHER PUBLICATIONS

G. Amblard et al., "Diffusion Phenomenon and Loss of Adhesion in Chemically Amplified Negative Resists", *Microelectronic Engineering*, 17, pp. 275-278 (1992).

(Continued)

*Primary Examiner*—Nicole Barreca
(74) *Attorney, Agent, or Firm*—Shirley L. Church

(57) ABSTRACT

One principal embodiment of the disclosure pertains to a method of optically fabricating a photomask using a direct write continuous wave laser, comprising a series of steps including: applying an organic antireflection coating over a surface of a photomask which includes a chrome-containing layer; applying a chemically-amplified DUV photoresist over the organic antireflection coating; post apply baking the DUV photoresist over a specific temperature range; exposing a surface of the DUV photoresist to the direct write continuous wave laser; and, post exposure baking the imaged DUV photoresist over a specific temperature range. The direct write continuous wave laser preferably operates at a wavelength of 244 nm or 257 nm. In an alternative embodiment, the organic antireflection coating may be applied over an inorganic antireflection coating which overlies the chrome containing layer.

11 Claims, 10 Drawing Sheets

U.S. PATENT DOCUMENTS

| | | | |
|---|---|---|---|
| 6,048,672 A | 4/2000 | Cameron et al. | 430/327 |
| 6,110,638 A | 8/2000 | Boggs et al. | 430/270.1 |
| 6,156,479 A | 12/2000 | Meador et al. | 430/270.1 |
| 6,169,029 B1 | 1/2001 | Yang | 438/671 |
| 6,183,915 B1 | 2/2001 | Rolfson | 430/5 |
| 6,200,736 B1 * | 3/2001 | Tan | 430/319 |
| 6,316,167 B1 | 11/2001 | Angelopoulos et al. | 430/313 |
| 6,340,553 B1 | 1/2002 | Oomori et al. | 430/270.1 |
| 6,353,209 B1 | 3/2002 | Schaper et al. | 219/444.1 |
| 6,433,348 B1 | 8/2002 | Abboud et al. | 250/492.2 |
| 6,605,394 B2 * | 8/2003 | Montgomery et al. | 430/5 |
| 2002/0012876 A1 | 1/2002 | Angelopolous et al. | 430/271.1 |
| 2002/0182514 A1 | 12/2002 | Montgomery et al. | 430/5 |

FOREIGN PATENT DOCUMENTS

| | | |
|---|---|---|
| EP | 0905565 | 3/1999 |
| EP | 0987600 | 3/2000 |
| EP | 0989460 | 3/2000 |
| EP | 1035442 | 9/2000 |
| EP | 1046958 | 10/2000 |
| GB | 2349148 | 10/2000 |
| JP | 10048831 | 2/1998 |
| JP | 10048832 | 2/1998 |
| WO | WO 0046643 | 8/2000 |
| WO | WO 0054105 | 9/2000 |

OTHER PUBLICATIONS

P. Buck et al., "Performance of the ALTA® 3500 scanned-laser mask lithography system", *Proceedings of the SPIE Conference on Photomask ad X-Ray Mask Technology V*, Kawasaki, Japan, SPIE vol. 3412, pp. 67-78 (Apr. 1998).

K. Katoh et al., "Improvement of Post Exposure Delay Stability of Chemically Amplified Positive Resist", *Proceedings of the SPIE Symposium on Photomask and X-Ray Mask Technology VI*, Yokohama, Japan, SPIE vol. 3748, pp. 62-68 (Sep. 1999).

K. Kemp et al., "Effects of DUV Resist Sensitivities on Lithographic Process Window", *SPIE*, vol. 3049, pp. 955-962 (1997).

C. A. Mack et al., "Matching Simulation and Experiment for Chemically Amplified Resists", *Proceedings of the SPIE Conference on Optical Microlithography XII*, SPIE vol. 3679, pp. 183-192 (Mar. 1999).

Z. Masnyj et al., "Evaluation of Negative DUV Resist UVN30 for Electron Beam Exposure of NGL Masks", *SPIE*, vol. 3997, pp. 525-529 (2000).

U. Okoroanyanwu et al., "Impact of Optical Absorption on Process Control for Sub-0.15-$\mu$m Device Patterning Using 193-nm Lithography", *SPIE*, vol. 3998, pp. 781-790 (2000).

C. P. Soo et al., "Enhancement or Reduction of Catalytic Dissolution Reaction in Chemically Amplified Resists by Substrate Contaminants", *IEEE Transactions on Semiconductor Manufacturing*, vol. 12, No. 4, pp. 462-469 (Nov. 1999).

M. Zuniga et al., "Application of a General Reaction/Diffusion Resist Model to Emerging Materials with Extension to Non-Actinic Exposure", *SPIE*, vol. 3049, pp. 256-268 (1997).

* cited by examiner

METHOD OF INCREASING THE SHELF LIFE OF A BLANK PHOTOMASK SUBSTRATE

This application is a divisional application of application Ser. No. 09/912,116, filed Jul. 23, 2001, which issued as U.S. Pat. No. 6,703,169 on Mar. 9, 2004.

FIELD OF THE INVENTION

In general, the present invention relates to a method of producing a lithographic mask (reticle) for use in the semiconductor industry. In particular, the invention pertains to a particular combination of process steps useful in preparing optically imaged high performance photomasks. The optical imaging of the photomask makes use of a deep ultraviolet (DUV) photoresist in combination with at least one antireflective coating (ARC). The DUV photoresist is imaged using an optical direct write continuous laser mask writing tool.

BRIEF DESCRIPTION OF THE BACKGROUND ART

Photoresist compositions are used in microlithographic processes for making miniaturized electronic components, such as in the fabrication of semiconductor device structures. The miniaturized electronic device structure patterns are typically created by transferring a pattern from a patterned masking layer overlying the semiconductor substrate rather than by direct write on the semiconductor substrate, because of the time economy which can be achieved by blanket processing through a patterned masking layer. With regard to semiconductor device processing, the patterned masking layer may be a patterned photoresist layer or may be a patterned "hard" masking layer (typically an inorganic material or a high temperature organic material) which resides on the surface of the semiconductor device structure to be patterned. The patterned masking layer is typically created using another mask which is frequently referred to as a photomask or reticle. A reticle is typically a thin layer of a metal-containing layer (such as a chrome-containing, molybdenum-containing, or tungsten-containing material, for example) deposited on a glass or quartz plate. The reticle is patterned to contain a "hard copy" of the individual device structure pattern to be recreated on the masking layer overlying a semiconductor structure.

A reticle may be created by a number of different techniques, depending on the method of writing the pattern on the reticle. Due to the dimensional requirements of today's semiconductor structures, the writing method is generally with a laser or e-beam. A typical process for forming a reticle may include: providing a glass or quartz plate, depositing a chrome-containing layer on the glass or quartz surface, depositing an antireflective coating (ARC) over the chrome-containing layer, applying a photoresist layer over the ARC layer, direct writing on the photoresist layer to form a desired pattern, developing the pattern in the photoresist layer, etching the pattern into the chrome layer, and removing the residual photoresist layer. When the area of the photoresist layer contacted by the writing radiation becomes easier to remove during development, the photoresist is referred to as a positive-working photoresist. When the area of the photoresist layer contacted by the writing radiation becomes more difficult to remove during development, the photoresist is referred to as a negative-working photoresist. Advanced reticle manufacturing materials frequently include combinations of layers of materials selected from chromium, chromium oxide, chromium oxynitride, molybdenum, molybdenum silicide, and molybdenum tungsten silicide, for example.

As previously mentioned, the reticle or photomask is used to transfer a pattern to an underlying photoresist, where the reticle is exposed to blanket radiation which passes through open areas of the reticle onto the surface of the photoresist. The photoresist is then developed and used to transfer the pattern to an underlying semiconductor structure. Due to present day pattern dimensional requirements, which are commonly less than 0.3 $\mu$m, the photoresist is preferably a chemically amplified DUV photoresist. In the making of the reticle itself, a chemically amplified DUV photoresist has been used in combination with a direct write electron beam writing tool. Additional work has been done recently using a direct write continuous wave laser tool available under the trade name ALTA™ from ETEC Systems Inc., Hillsboro, Oreg.

Preparation of a photomask/reticle is a complicated process involving a number of interrelated steps which affect the critical dimensions of a pattern produced in the reticle, and the uniformity of the pattern critical dimensions across the surface area of the reticle. By changing various steps in the reticle manufacturing process, the reproducibility of the manufacturing process itself may be altered, including the processing window. Processing window refers to the amount process conditions can be varied without having a detrimental outcome on the product produced. The larger the processing window, the greater change permitted in processing conditions without a detrimental affect on the product. Thus, a larger process window is desirable, as this generally results in a higher yield of in specification product produced.

Various efforts are made within the industry to improve the reliability of manufacturing processes by improving individual process steps; however, when a production process involves a number of interrelated process steps, alteration of an individual process step may have an unexpected result on other interrelated process steps.

The reticle manufacturing process steps generally include the following, where the initial substrate used to form the reticle is a silicon oxide-containing base layer having a layer of a metal-containing (typically chrome) mask material applied thereover. An inorganic antireflective coating (ARC) or an organic ARC, or a combination of inorganic and organic ARC layers may be applied over the surface of the chrome mask material. A photoresist layer is then applied over the antireflective coating. The photoresist is typically an organic material which is dissolved or dispersed in a solvent. The solution or dispersion of photoresist is typically spin coated onto the surface of the photomask fabrication structure. Typically, the photoresist is applied over an ARC layer on the fabrication structure surface. Some of the solvent or dispersion medium is removed during the spin coating operation. Residual solvent or dispersion medium is subsequently removed by another means, typically by baking the fabrication structure, including the photoresist layer. This step is commonly referred to as "Post Apply Bake" or PAB. The photoresist is then exposed to radiation (imaged), to produce a pattern in the photoresist layer, typically by a direct write process when the pattern includes dimensions which are less than about 0.3 $\mu$m or less. After exposure, the substrate including the photoresist layer is baked again. The second baking is typically referred to as "Post Exposure Bake" or PEB. The photoresist is then developed either using a dry process or a wet process, to create the pattern having openings through the photoresist layer thickness.

Once the photoresist is "patterned" so that the pattern openings extend through the photoresist layer to the upper surface of an ARC layer, or to a surface beneath an ARC layer, the pattern in the patterned photoresist is transferred through the chrome-based mask layer and any remaining layers overlying the chrome layer, for example, typically by dry etching.

U.S. patent application Ser. No. 09/848,859, filed May 3, 2001, titled: "Organic Bottom Antireflective Coating For High Performance Mask Making Using Optical Imaging", and assigned to the assignee of the present invention, describes a reticle fabrication process in general. This patent application is hereby incorporated by reference in its entirety. As disclosed in the '859 application, there are a number of problems encountered in trying to produce a photomask/reticle when the photomask pattern exhibits critical dimensions of less than 0.3 µm. Further, producing a reticle where pattern critical dimensions are uniform across the entire reticle surface requires careful control of process variables in each step of the reticle manufacturing process. For example, the developed (patterned) photoresist on the surface of the underlying substrate, prior to pattern transfer, frequently exhibits a "foot" at the bottom of the pattern profile, where the photoresist layer interfaces with an underlying ARC layer on a chrome-containing surface, despite the presence of the underlying ARC layer (which is typically a chrome oxynitride material). The foot is not uniform in size across the reticle substrate surface because the basisity changes somewhat randomly across the substrate surface. Since the foot is variable, it makes it difficult to do the metrology which is used to determine whether the finished reticle will meet dimensional requirements.

Some imaged and developed positive tone photoresists exhibit a "t"-top profile. In addition, the surface of the patterned photoresist layer typically exhibits standing waves, due to reflections which occur during the direct writing on the photoresist layer, despite the presence of the underlying ARC layer.

In their 1992 paper in Microelectronic Engineering (Vol. 17 (1992) 275–278) Gilles Amblard et al. describe how the development of chemically amplified (CA) resist systems has been the most successful approach to meeting the challenge of high resolution and high speed, posed by X-Ray, Electron-Beam or Deep UV lithography. However, they discovered that pattern profile abnormalities appear which limit the use of a negative resist. Even though the correct exposure dose is applied throughout the thickness of the desired pattern, an aqueous developer dissolves the bottom part of the resist in contact with or near the underlying substrate. Fissures as thick as 0.1 to 0.2 µm were observed in the pattern at the interface with the substrate, resulting in a loss of adhesion in fine patterns. The problem was observed for resists imaged and developed on both spin on glass (SOG) and aluminum substrates.

Japanese Patent No. 10048831 assigned to Sony Corp and granted Feb. 20, 1998, relates to patterning of a chemical amplification-based resist film on a film which is to be patterned. The composition of the film to be patterned is not specified in the English abstract of the Japanese patent. The formation process comprises: (a) covering the film to be patterned with a protective coating consisting of chalcogen except sulphur; (b) depositing the chemical amplification-based resist film on the protective coating; (c) applying selective exposure, baking after exposure, and development of the chemical amplification-based resist film to form a resist pattern; and (d) selectively removing the exposed portion of the protective coating. The advantage is said to be that the surface of the film to be patterned is previously passivated by the protective coating. This prevents diffusion of active species between the chemical amplification-based resist film and the film to be patterned and prevents the active species from a decrease in its concentration around the interface against the film to be patterned. The resulting resist pattern is said to have "no unusual shape", In U.S. Pat. No. 5,723,237 to Kobayashi et al., issued Mar. 3, 1998, the inventors disclose a method for determining baking conditions for resist pattern formation through development of unexposed trial resist films. In particular, resist patterns which minimize the standard deviations of critical dimensions within a plate and between plates (namely which minimize the critical dimensions) are formed by a specialized method. The method permits determining conditions for resist pattern formation which includes a film forming process, a resist film baking process, an exposing process, and a developing process. The method includes preparing a plurality of plates, each having a resist film formed thereon, baking the resist films on the plates, with each plate having a different baking condition. Without performing an exposure of the film to pattern imaging, the baked films are subjected to a dissolving treatment to induce partial dissolution of the resist films. The data derived is used in determining the temperature condition for baking a prospective resist film in a manner which minimizes the change in uniformity of the remaining resist thickness (after partial dissolution) across the plate.

FIG. 1 (not taken from the '237 patent, but published by the assignee of the patent, Hoya) shows a graph 100 of the thickness uniformity across a reticle plate, for a photoresist film having an initial thickness of about 5,000 Å, after subjection to a dissolving treatment which reduced the mean film thickness. Axis 120 of the graph 100 shows the range of film thickness variation across the reticle plate as a function of the PAB temperature. The thickness uniformity (of the remaining film) is shown as a function of the post apply bake (PAB) temperature on graph axis 110. The temperature measured was that of a hotplate under the reticle plate rather than the temperature of the photoresist itself, however. The data is shown for films of a DUV photoresist (DX1100P/AR3 which is available from AZ Clariant Corp. of Somerville, N.J.). The DUV photoresist films were baked at a given PAB temperature for time periods of 9 minutes (curve 112), 12 minutes (curve 114), or 15 minutes (curve 116). FIG. 1 also shows the rate of change of the normalized film thickness as a % of the original film thickness on graph axis 130, as a function of the PAB temperature illustrated on graph axis 110 for films baked for various time periods. A bake period of 9 minutes is shown on curve 102, 12 minutes is shown on curve 104, and 15 minutes is shown on curve 106. Clearly the PAB temperature is important with respect to development of a photoresist both in terms of the development rate and the uniformity of development across the surface of the photoresist.

In their paper entitled: "Improvement of Post Exposure Delay Stability Of Chemically Amplified Positive Resist", presented at the SPIE Symposium on Photomask and X-Ray Technology VI, Yokohama Japan, September 1999 (SPIE) Vol. 3748. 0277–786X/99, Kohji Katoh et al describe the development of a novolak-based chemically amplified positive resist for next generation photomask (below 0.18 µm) fabrication. The resist is said to prevent footing at the base of a profile by the use of a hydrophilic polyphenol compound. The resist was used to make a well defined 0.25 µm line-and-space pattern on a $CrO_x$ substrate at a dose of 4.0 uC/cm$^2$. The advanced high acceleration voltage (50 kV)

E-beam writer HL-800M was developed to provide better critical dimension control. However, the high acceleration voltage lowers the sensitivity of resists. To compensate, a chemically amplified resist was needed. The resist developed includes four components: a novolak matrix resin, a polyphenol compound, an acid generator, and a dissolution inhibitor.

In their paper "Enhancement or Reduction of Catalytic Dissolution Reaction in Chemically Amplified Resists by Substrate Contaminants" (published in IEEE Transactions On Semiconductor Manufacturing, Vol. 12, No. 4, November 1999), Choi Pheng Soo et al. describe the chemical interaction of resist and substrate at the interface, which modifies the dissolution reaction, and has degraded sidewall profile of the resist features. Depending on the nature of the residue on the substrate, the "bottom pinching" (BP) effect and footing are observed, especially for negative chemically amplified (CA) resists. The BP effect is observed for CA resist on top of an organic bottom antireflection coating (BARC). The BP is attributed to the acid generated from the underlying organic BARC. With optimization on soft bake temperature of BARC, the BP effect is said to be eliminated.

European Patent Application No. EPO 987 600 A1 of Timothy G. Adams et al: assigned to Shipley Company LLC, published Mar. 22, 2000, describes new light absorbing crosslinking compositions suitable for use as an antireflective composition (ARC), particularly suitable for short wavelength imaging applications such as 193 nm. The ARCs are preferably used with an overcoated resist layer (i.e. as bottom layer ARCs) and in general comprise ARC resin binders that can effectively absorb reflected sub-200 nm exposure radiation. In particular, the antireflective composition comprises a resin binder that has phenol groups. The phenol groups are described as directly pendant from the resin backbone of the antireflective composition resin.

The above descriptions pertain to the use of chemically amplified photoresist on semiconductor substrates, or to the use of a chemically amplified photoresist in combination with electron beam lithography to produce a reticle. The present invention is different in that it pertains to the use of an optical system, a direct write continuous wave laser, to image a chemically amplified photoresist which is used to transfer a pattern to a photomask (reticle). However, many of the problems described above are experienced in producing a reticle using an optical imaging system in combination with a chemically amplified photoresist.

FIG. 2A shows a schematic of a cross-sectional view of a prior art starting structure 200 used to form a reticle, including, from bottom to top, a quartz substrate 202, overlaid with chrome-containing layer 204, overlaid with an ARC layer 206, and a positive tone photoresist layer 208. As shown in FIGS. 2B and 2C, after patterning of the photoresist layer 208 using an electron-beam writing tool, there is often a "foot" 210 extending from the lower portion of patterned photoresist layer 208 toward the surface 216 of ARC layer 206. The presence of a foot (feet) 210 makes it difficult to maintain control of the critical dimensions during subsequent etch transferring of the photoresist pattern through the ARC layer 206 and chrome containing layer 204. The foot also impacts the metrology capabilities of the lithographer.

FIG. 2C, which is an enlargement (from FIG. 2B) of a portion of the patterned photoresist layer 208 (with underlying ARC layer 206), shows a line 207 which exhibits "t"-topping 213 in the upper portion of line 207, feet 210 at the base of line 207, and ripples (standing waves) 214 on the sidewall 211 surfaces 212 of line 207. The "t"-topping 213 is believed to be caused by contamination/reaction which occurs at the upper surface of the photoresist layer during processing prior to development of the pattern. The standing waves 214 are generated by reflected radiation within the photoresist material, which occurs during the direct writing of the pattern into photoresist layer 208 by the electron-beam writing tool. The ARC layer 206 helps reduce the standing wave effect by reducing reflection back from underlying layers and device features into the photoresist layer 208, but standing waves are generated in varying degrees depending on the imaging system and the material composition of the particular photoresist. When the photoresist is a chemically amplified photoresist, transparency of the photoresist material is particularly high throughout the entire direct writing process; this results in increased reflectivity (greater than that for earlier i-line novolak photoresists), which increases the formation of standing waves 214.

FIG. 2D illustrates a side view schematic of a developed photoresist which is a negative tone DUV chemically amplified photoresist. The developed resist exhibits "pinching" at the base of a line pattern, as shown in FIG. 2D. A line 221 in negative tone patterned photoresist 228 exhibits standing waves 224 on sidewall surface 222 and a narrowing or "pinching" at the base 230 of line 221. The pinching occurs because, in a negative tone resist 228, the irradiated portion of the resist reacts (typically crosslinks) to form a polymer which is insoluble in the developing solution during development of the pattern. Photoresist 228 sidewall surface 222 is undercut as indicated by arrows 232 during development of the irradiated pattern including line 221.

It is readily apparent that it would be highly desirable to have a method of making a photomask which provides features having critical dimensions of 0.3 μm or less, where the uniformity of the critical dimensions is maintained across the entire surface of the photomask. To accomplish this, it is necessary to have a method of producing a patterned, developed photoresist which is imaged and developed uniformly across the photomask surface. The developed pattern profile of the photoresist needs to exhibit minimal surface distortions in the form of feet at the base, "t"-topping at the top of the resist, and standing waves along the sidewalls of the developed photoresist. This improved developed photoresist can be used to transfer the pattern for the feature to an underlying photomask (reticle).

SUMMARY OF THE INVENTION

The present invention pertains to a method of optically fabricating a photomask using a direct write continuous wave laser, which includes the steps of applying an organic antireflection coating over a metal-containing layer; applying a chemically-amplified DUV photoresist, either positive tone or negative tone, over the organic antireflection coating; baking the DUV photoresist at a temperature within a specifically designed range under ambient conditions, with volatile removal assisted by an exhaust hood fan or by similar method (PAB); exposing a surface of the DUV photoresist to radiation from the direct write continuous wave laser; baking the developed photoresist at a temperature within a specifically designed range, again under ambient conditions using an exhausted hot plate (PEB); and, developing the image within the DUV photoresist. Preferably the laser used to image the DUV photoresist is operated at 244 or 257 nm, although other wavelengths may be used. Subsequently, the developed, patterned photoresist is used as a mask for transferring the pattern through a metal-containing layer of the photomask substrate. Typically the pattern transfer is by dry etch. The metal-containing layer of the photomask substrate may include combinations of layers of materials selected from chromium, chromium oxide, chromium oxynitride, molybdenum, molybdenum silicide, and molybdenum tungsten silicide, for example and not by way of limitation.

A preferred antireflection coating (ARC) is organic and may be selected from a negative photoresist containing a DUV dye; a polymeric material prepared from acrylic polymers or copolymers; a binder resin combined with an acid or thermal acid generator and a photoacid generator compound; a binder resin having pendent phenyl groups; and combinations thereof. The organic anti-reflective coating composition preferably comprises acrylic polymers and/or copolymers.

In an alternative embodiment of the method of fabricating a photomask, the ARC may be an inorganic ARC selected to include a material such as chrome oxynitride, titanium nitride, silicon nitride or molybdenum silicide. Further, the ARC used may be a combination of organic and inorganic ARCs. For example, an organic ARC may be applied over the surface of an inorganic ARC.

The post apply bake (PAB) of the photoresist is coordinated with the post exposure bake (PEB) of the photoresist, to obtain both a more uniform critical dimension (CD) of the patterned photoresist across the photomask substrate and a long stability period for a photoresist-coated photomask substrate. The long stability period permits application of the photoresist to the substrate considerably in advance of imaging (exposure) of the photoresist. This permits storage and shipping of the photoresist-coated substrate at the convenience of the manufacturer, prior to actual patterning of the resist.

BRIEF DESCRIPTION OF THE DRAWINGS

FIG. 11 shows a schematic cross-sectional view of beginning structure 1100 of a stack of materials used in the production of a photomask or reticle. The stack from bottom to top includes a substrate 1102 which is typically selected from quartz, fluorinated quartz, borosilicate glass, or soda lime glass; a metal-containing layer 1104 which is typically selected from a chromium, molybdenum, or tungsten-containing layer, or combinations thereof. In the examples described herein, the metal-containing layer is essentially chrome; an inorganic ARC layer 1105; an organic ARC layer 1106; and a DUV photoresist layer 1108.

FIG. 11B shows the FIG. 11A structure after a direct write continuous wave laser patterning of DUV photoresist layer 1108. A pattern of lines and spaces has been created in DUV photoresist layer 1108. The upper portion 1110 of each line 1107 does not exhibit a "t" top of the kind which was observed when the previously known patterning art was used (a "t" top 113 is shown in FIG. 1B). There is no foot at the base 1112 of the line 207, where the base 1112 is in contact with organic ARC layer 1106. Standing waves of the kind which were observed when the previously known patterning art was used (standing wave 114 is shown in FIG. 1B) were not observed when the present patterning method was used.

FIG. 11C shows an enlargement of a portion of FIG. 11B, which shows the details of line 1107, including a well shaped upper portion 1110, a clean intersection at the base 1112 where line 1107 intersects the surface 1109 of organic ARC 1106, and the absence of standing waves.

FIG. 12A shows a schematic cross-sectional view of beginning structure 1200 of a stack of materials used in the production of a photomask or reticle. The stack from bottom to top includes a substrate 1202 which is typically selected from quartz, fluorinated quartz, borosilicate glass, or soda lime glass; a metal-containing layer 1204, which is typically selected from a chromium, molybdenum, or tungsten-containing layer, or combinations thereof. In the examples described herein, the metal-containing layer is essentially chrome; an organic ARC layer 1206; and a DUV photoresist layer 1208.

FIG. 12B shows the FIG. 12A structure after a direct write continuous wave laser patterning of DUV photoresist layer 1208. A pattern of lines and spaces has been created in DUV photoresist layer 1208. The upper portion 1212 of each line 1207 does not exhibit a "t" top of the kind which was observed when the previously known patterning art was used (113 as shown in FIG. 1B). There is no foot at the base 1214 of the line 1207, where the base 1214 is in contact with organic ARC layer 1208. Standing waves of the kind which were observed when the previously known patterning art was used (114 as shown in FIG. 1B) were not observed when the present patterning method was used.

FIG. 12C shows an enlargement of a portion of FIG. 12B, which shows the details of line 1207, including a well shaped upper portion 1212, a clean intersection at the base 1214 where line 1207 intersects the surface 1209 of organic ARC 1206, and the absence of standing waves.

DETAILED DESCRIPTION OF THE INVENTION

As a preface to the detailed description, it should be noted that, as used in this specification and the appended claims, the singular forms "a", "an", and "the" include plural referents, unless the context clearly dictates otherwise.

As mentioned in the Background Art section above, reflections from underlying materials frequently create standing waves on the surface of a patterned photoresist. Further, due to chemical reactions which take place between the photoresist and a layer underlying a positive tone photoresist, undeveloped areas may occur at the base of a patterned photoresist (these undeveloped areas are commonly referred to as a foot or as feet). As mentioned in the Background Art section, the presence of standing waves and feet on the surface of a patterned photoresist affects the critical dimensions of a semiconductor device or a photomask which is produced using the patterned photoresist to transfer a pattern into the surface of the semiconductor device or photomask.

Figure 2A:
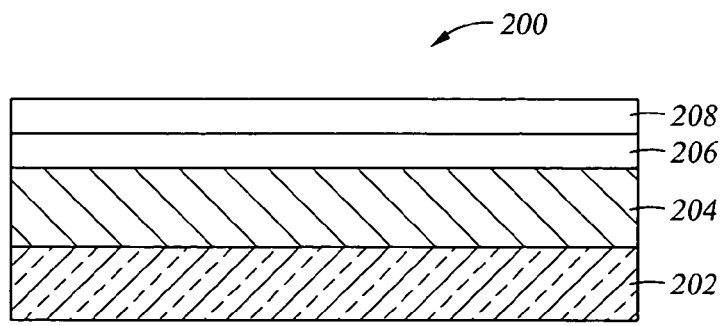
FIG. 2A shows a schematic cross-sectional view of beginning structure 200 of a stack of materials used in the production of a photomask or reticle. The stack from bottom to top includes a substrate 202 which is typically selected from quartz, fluorinated quartz, borosilicate glass, or soda lime glass; a chrome-containing layer 204; an inorganic ARC layer such as chrome oxynitride, titanium nitride, silicon nitride, or molybdenum silicide 206; and a DUV photoresist layer 208.
Figure 2B:
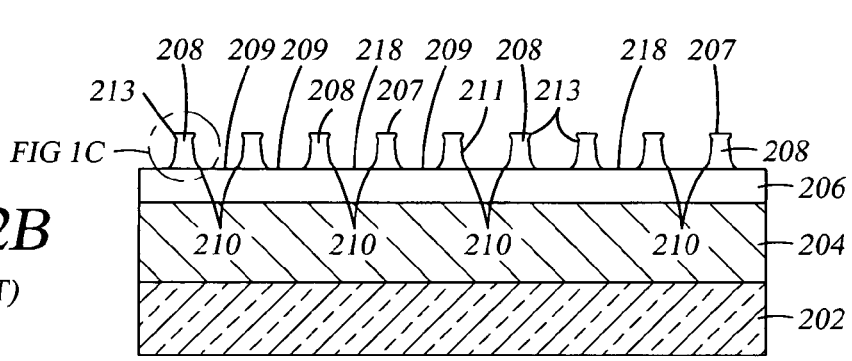
FIG. 2B shows the FIG. 2A structure after a direct write patterning of DUV photoresist layer 208 using an e-beam writing tool. A pattern of lines and spaces has been created in a positive tone DUV photoresist layer 208. The upper portion of each line 207 exhibits a "t" top 213, has at its base a foot 210 which is in contact with the upper surface 218 of ARC layer 206, and exhibits standing waves 214 (not shown in FIG. 2B, but shown in FIG. 2C).
Figure 2C:
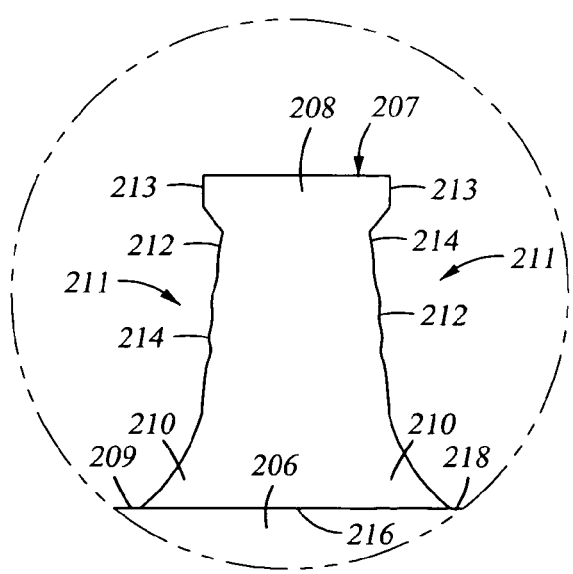
FIG. 2C shows an enlargement of a portion of FIG. 2B, which shows the details of line 207, including the "t" top 213, the feet 210, and ripples/standing waves 214 on the surface 212 of sidewalls 211 of line 207.

When the photoresist is a positive tone chemically amplified photoresist, such as a positive tone DUV photoresist, the "t"-topping and standing wave problems are magnified. In addition, positive tone chemically amplified photoresists typically exhibit an increased problem in the area of foot formation. FIG. 2C illustrates a schematic of a cross-sectional view of a line 207 in a positive tone patterned photoresist 208 which exhibits "t"-topping 213, standing waves 214 on sidewall 211 surfaces 212, and feet 210 at the base.

Figure 2D:
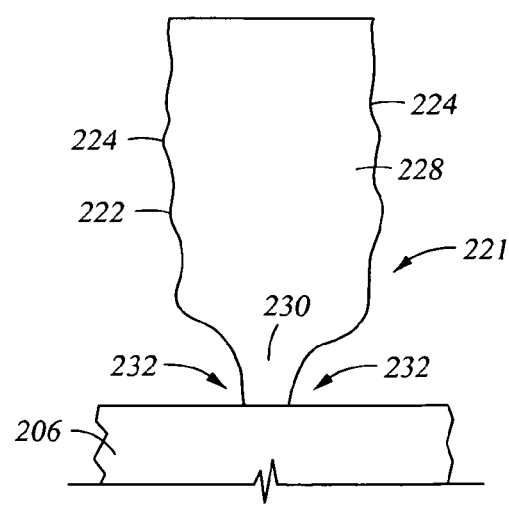
FIG. 2D shows a schematic of a cross-sectional view of a developed photoresist of the kind shown in FIG. 2C, except that the profile of the photoresist is that which would be created when a negative tone DUV photoresist layer 228 is used to produce the developed lines and spaces pattern of the kind shown in FIG. 2B. Negative tone photoresist layer 228 overlies inorganic ARC layer 206. The profile of the developed line 221 includes standing waves 224 on sidewall 222 of developed resist 228. The base 230 of the line 221 is undercut as indicated by arrows 232, to produce a line 221 which is "pinched" at its base 230.

When the photoresist is a negative tone chemically amplified photoresist, such as a negative tone DUV photoresist, the standing wave problems are significant and, in addition, negative tone chemically amplified photoresists typically exhibit a "pinching" at the base of a line pattern, as shown in FIG. 2D. FIG. 2D illustrates a schematic of a cross sectional view of a line 221 in a negative tone patterned photoresist 228 which exhibits standing waves 224 on sidewall surface 222 and a narrowing or "pinching" at the base 230 of line 221. The pinching occurs because, in a negative tone resist 228, the irradiated portion of the resist reacts (typically crosslinks) to form a polymer which is insoluble in the developing solution (during development of the pattern). Due to neutralization of a portion of the chemical reaction at the upper surface of inorganic ARC layer 206, the photoresist 228 is not sufficiently reacted at its base 230 adjacent inorganic ARC layer 206. Photoresist 228 sidewall surface 222 is undercut as indicated by arrows 232 during development of the irradiated pattern including line 221.

We have discovered a method of patterning either a positive tone or a negative tone photoresist structure overlying a photomask, which avoids or reduces the amount of "t"-topping, standing waves, and feet present on the patterned photoresist structure. This enables the patterning of the photomask in a manner which enhances critical dimension control of the patterned mask. Further, the method includes the use of a combination of PAB and PEB processes which assist in obtaining a uniform critical dimension across the entire surface of the patterned mask. The method provides a broader process window for fabrication of a photomask/reticle and enables the use of metrology after patterning of the photoresist rather than after patterning of the photomask itself, which provides considerable cost savings in the production of photomasks.

I. Apparatus for Practicing the Invention

The imaging system used to practice the method subsequently described herein is a new apparatus which may be a 244 nm or a 257 nm mask writing laser tool available from ETEC Systems Inc., Hillsboro, Oreg. This direct write continuous wave laser tool, available under the trade name ALTA™, is a raster-scan writing system. The system contains a polygon that rotates, reflecting 32 laser beams off each facet, and scans the beams (referred to as the brush) across the substrate. The writing quality specifications for the 257 nm ALTA™ mask writing laser tool include a minimum feature size of about 400 nm (enabling the user to realize features at 50% of specification, or 200 nm). The 257 nm ALTA™ mask writing laser tool provides the user with advanced feature critical dimension (CD) control, linearity, and uniformity. However, realization of the complete performance potential in the fabricated mask depends on the use of appropriate process materials and processing methods during fabrication of the mask.

Figure 9:
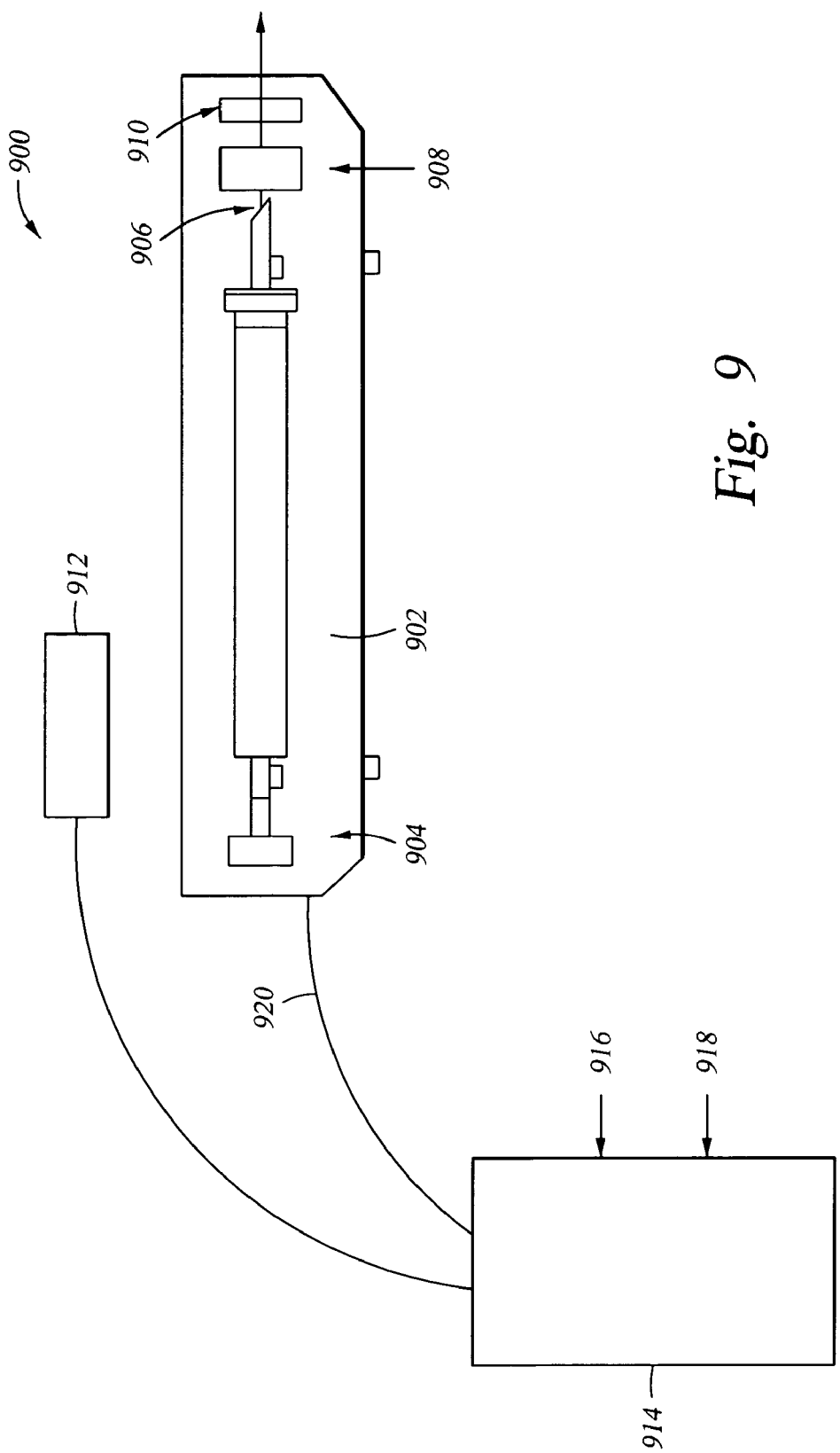
FIG. 9 shows a simplified schematic of the direct write continuous wave laser system components which were present in the tool used in the Examples which follow, to image a photoresist prior to transfer of the pattern to an underlying photomask.

FIG. 9 shows a simplified schematic of the direct write continuous wave laser system components which were present in the tool used to image the photoresists described in the Examples which follow. The laser system 900 included the DUV laser head 902. Laser head 902 included a high reflector 904, a Brewster window 906, an output coupler 908, and a safety shutter 910. The light source was an argon-ion gas laser that is operated at a single line (514 nm) in the fundamental mode ($TEM_{00}$). This green line is then frequency doubled via an intra-cavity beta-barium borate (BBO) crystal to produce laser light at 257 nm. Due to the physics and the geometry of the doubling process, the intensity profile of the 257 nm beam is describable by a $sinc^2$ function. The side lobes of the $sinc^2$ profile are filtered to produce a predictable near-Gaussian profile beam used for printing by the ALTA™ system.

The maximum DUV output power is approximately 1.5 W. The laser is operated at lower power levels to protect optical coatings and extend the life of the laser. The laser head 902 is mounted behind a bridge (not shown) on a granite slab (not shown). As shown in FIG. 9, a remote module 912 provides control signals to a central panel 914. Further, cooling water, indicated by arrow 916 and electrical power, indicated by arrow 918, (480 V from a power distribution center not shown) are also provided to central panel 914. A laser umbilical 920 carries water, power, and the control signals to laser head 902.

Figure 10:
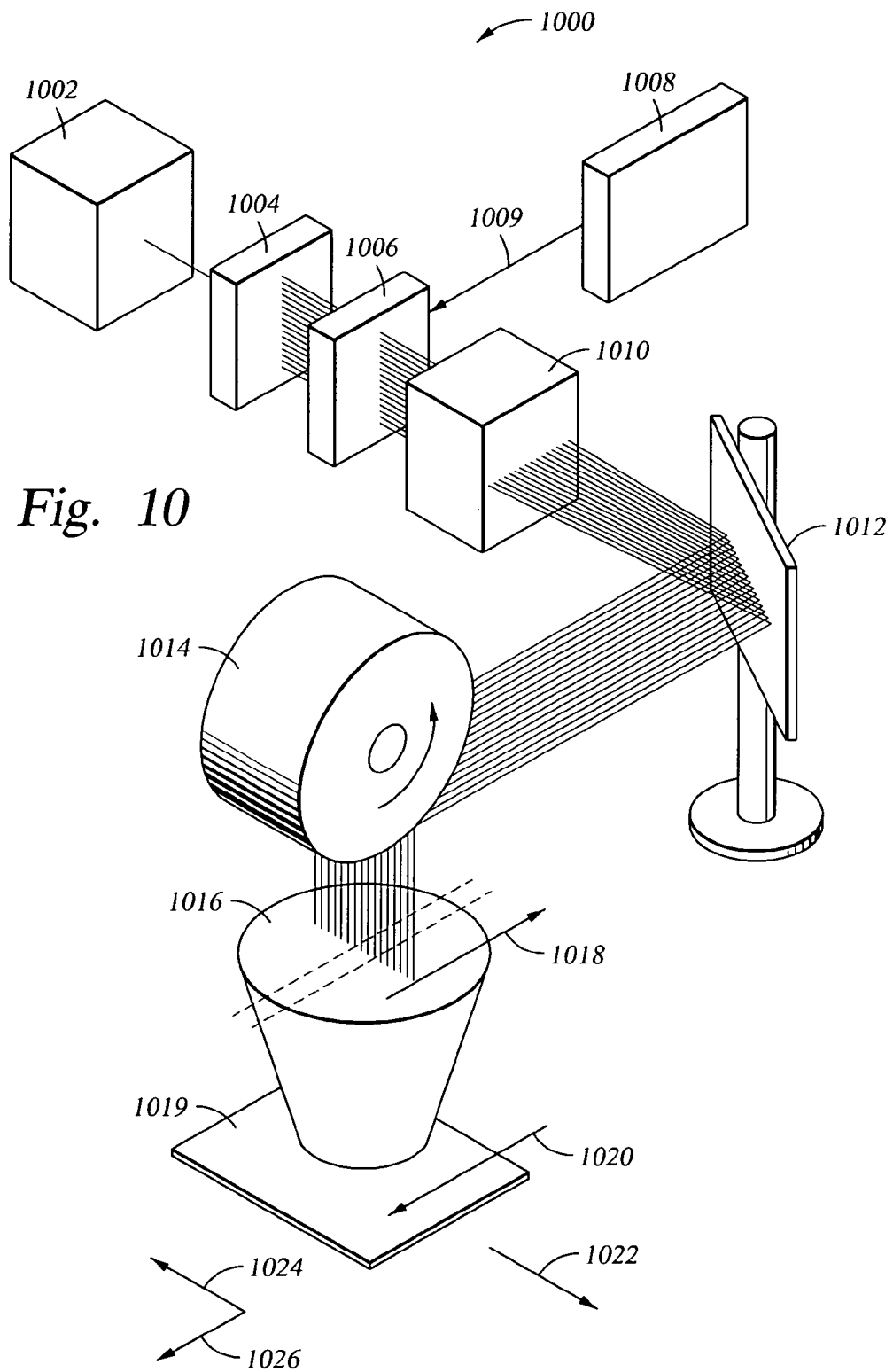
FIG. 10 shows a simplified schematic of the optical architecture of an ALTA™ 257 nm direct write continuous wave laser of the kind used in the Examples which follow, to image the photoresists prior to transfer of the pattern to an underlying photomask.

FIG. 10 shows a simplified schematic of the optical architecture of an ALTA™ 257 nm direct write continuous wave laser of the kind used to image photoresists in the Examples which follow. The optical architecture 1000 includes a DUV laser source 1002; a multiple beam splitter 1004; an acousto-optic modulator 1006; geometry engines, beam boards and clock boards which present in data module 1008, which provides electronic pixel data 1009; a K-mirror 1010; a steering mirror 1012; a rotating 24 facet polygon 1014; a reduction lens 1016 with arrow 1018 indicating scan direction before the reduction lens; and the photomask substrate plate 1019, with arrow 1020 indicating the scan direction at plate 1019, and arrow 1022 indicating the direction of plate motion. Arrow 1024 indicates the stripe axis, while arrow 1026 indicates the scan axis. For additional information regarding the optical architecture of the ALTA™ 257 nm direct write continuous wave laser, one skilled in the art should contact ETEC Systems of Hillsboro, Oreg.

II. Method of Patterning a Photomask

All methods of patterning a photomask may benefit from application of the present method. The method is particularly useful for optically patterning a photomask when a chemically amplified DUV photoresist is used to transfer the pattern to the photomask. The present Examples are for an acrylic-based chemically amplified photoresist. However, the scope of the invention is not intended to be limited to this family of chemically amplified photoresists.

EXAMPLES

Example One

Figure 11A:
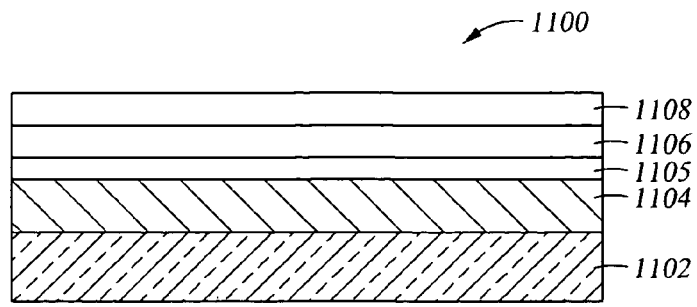
FIGS. 11A–11C illustrate one embodiment of the present invention which illustrates a method for the optical, direct write continuous wave laser patterning of a chemically amplified photoresist which produces a pattern having a cross-sectional profile which enables critical dimension control during transfer of the pattern into an underlying photomask substrate.

FIG. 11A shows a starting structure 1100 used in the fabrication of a photomask, hereafter referred to as a reticle. In this Example, starting structure 1100 was a stack of layers (not shown to scale) which included, from top to bottom, a 5,000 Å thick layer 1108 of a chemically amplified DUV photoresist, DX1100 (available from AZ Clariant Corp. of Somerville, N.J.); a 470 Å thick layer 1106 of an organic ARC identified as KRF 17G (available from AZ/Clariant); a 250 Å thick layer 1105 of chromium oxynitride inorganic ARC; a 750 Å thick layer 1104 of chrome mask material; and a silicon oxide-containing substrate 1102.

In particular, the chemically amplified DUV photoresist, DX1100, comprises propylene glycol monomethyl ether acetate (PGMEA); PMA; 1-methoxy-2-propyl acetate; modified phenolic polymer; and an onium salt metal halide complex as a chemical amplifier. This DUV photoresist is applied over the surface of underlying organic ARC layer 1106 in the manner described by the manufacturer. However, after application of the photoresist film, applicants performed a post apply bake (PAB) which was specially designed to work in combination with a post exposure bake (PEB) which was to be carried out after the application of radiation to the resist (exposure to create an undeveloped image/latent image within the resist layer).

Figure 1:
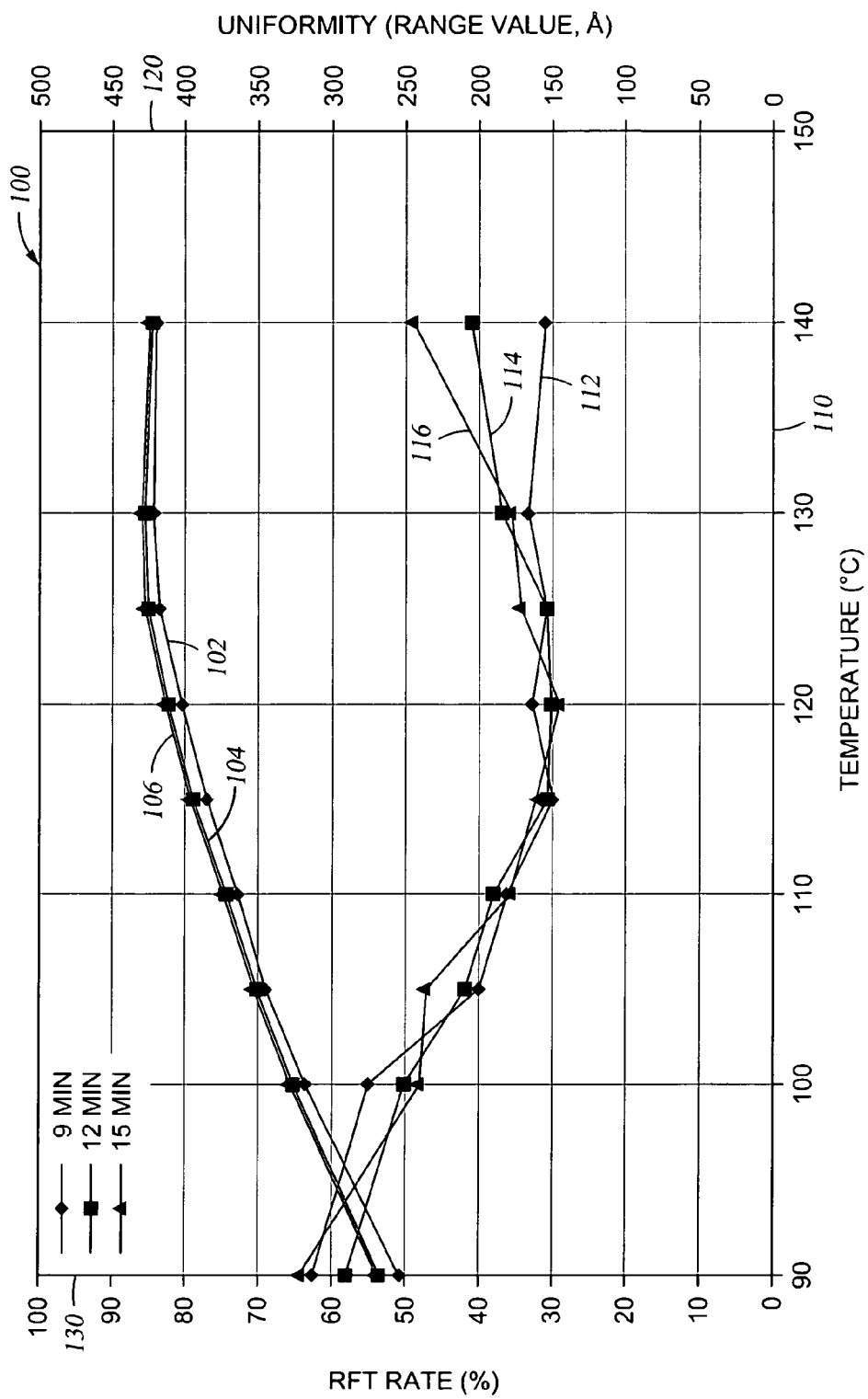
FIG. 1 shows the prior art illustrating the importance of post application bake (PAB) in determining the development characteristics of a chemically amplified DUV photoresist film. In particular, the uniformity of film thickness in Å is presented on Graph 100 axis 120 as a function of the PAB temperature, which is presented on axis 110.

The importance of a PAB was previously mentioned with respect to the prior art which has indicated the importance of a PAB in determining the development rate and uniformity of development of the resist material. This feature was described with respect to FIG. 1. FIG. 1 indicates that, in terms of development rate and uniformity of development, a PAB temperature ranging from about 120° C. to about 130° C. should produce good results. It is important to mention once again that the temperature referred to in FIG. 1 is that of a hotplate under a photomask plate rather than the temperature of the photoresist itself. Applicants have measured the set point temperature at the photoresist/ARC interface, so that the data provided is independent of the kind of apparatus used for heating the photomask plate.

Applicants have discovered that an improved, excellent CD uniformity for the patterned chrome layer of the photomask is obtained when the PAB is below about 115° C., ranging from about 105° C. to about 115° C., and preferably is about 108° C. This PAB is used in combination with a PEB which is carried out after exposure of the photoresist to radiation. The PEB is preferably carried out over a temperature ranging from about 70° C. and about 95° C., preferably between about 70° C. and about 90° C., and more preferably at about 88° C. Again, the PEB is measured at the photoresist/ARC interface.

Figure 5:
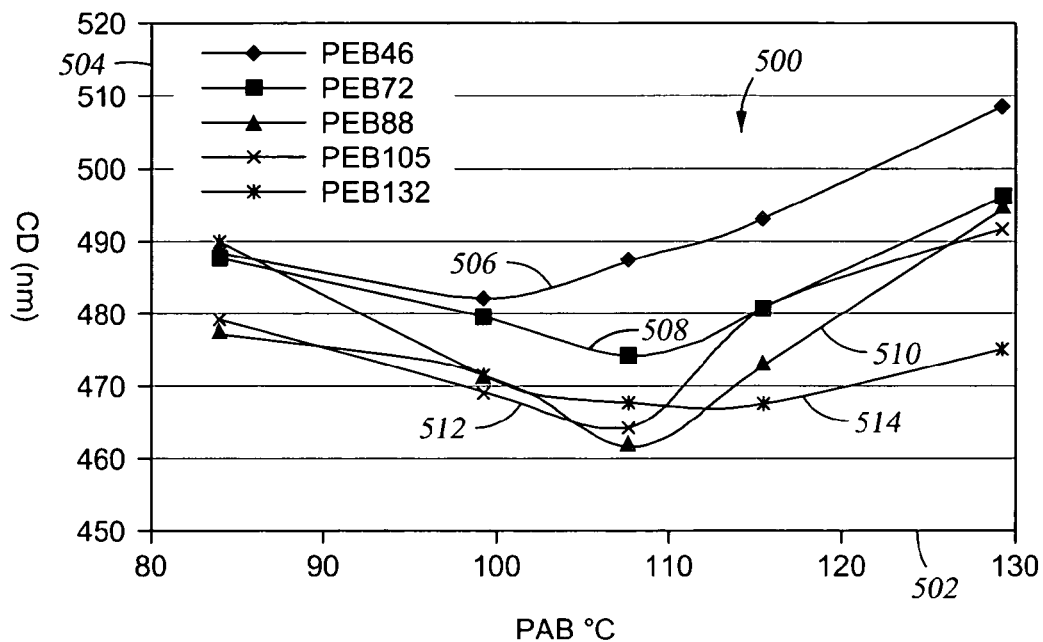
FIG. 5 is a graph 500 showing change in critical dimension for a patterned line (in the form of a linear open space), in chrome, as a function of the PAB temperature, where each curve represents a different PEB temperature, used in combination with the PAB at the specified temperature.

FIG. 5 shows a graph 500 which illustrates pattern critical dimension (CD) sensitivity to PAB temperature at various PEB temperatures. The CD is for the patterned chrome-containing layer of the mask obtained after transfer of the pattern from the photoresist using a dry etch process. The data was generated using a DX1100 chemically amplified DUV photoresist. CD's, which are illustrated on axis 504 in nm, measured after transfer of the developed pattern to the photomask (in chrome), were determined using a Leica LWM 250 and a transmitted UV light source. The PAB temperature is shown in ° C. on axis 502. PEB curves 506 representing 46° C., 508 representing 72° C., 510 representing 88° C., 512, representing 105° C., and 514 representing 132° C., show a 1$^{st}$ derivative minimum for CD sensitivity near a PAB temperature of 108° C.

Figure 6:
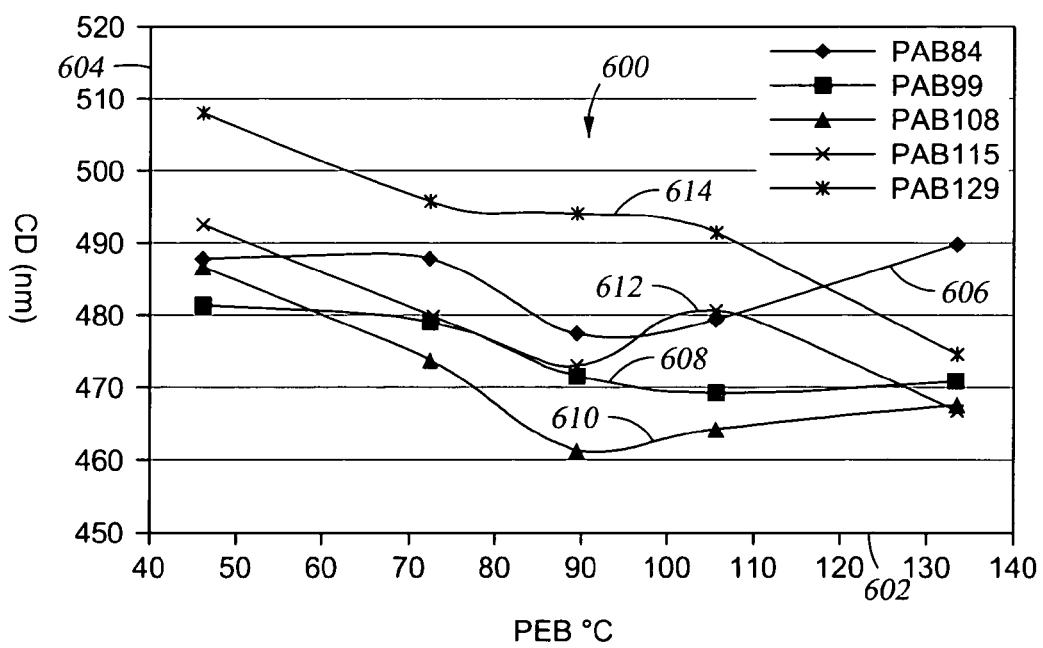
FIG. 6 is a graph 600 showing change in critical dimension for a patterned line, in chrome, as a function of the PEB temperature, where each curve represents a different PAB temperature, used in combination with the PEB at the specified temperature.

FIG. 6 shows a graph 600 which illustrates CD sensitivity to PEB temperature at various PAB temperatures. CD's, in nm, which are illustrated on axis 604, were measured in chrome as described above with reference to FIG. 5. The PEB temperature is shown in ° C. on axis 602. PAB curves 606 representing 84° C., 608 representing 99° C., 610, representing 108° C., 612 representing 115° C., and 614 representing 129° C. show a 1$^{st}$ derivative minimum for CD sensitivity for the 108° C. PAB temperature occurs at a PEB of about 88° C. In all instances, the PAB and PEB were carried out under the following conditions. The photomask substrate (photomask plate) temperature was ramped up from room temperature to the desired temperature over a time period of at least 180 seconds, so that the heat transfer would be uniform over the entire photomask plate surface, ensuring that temperature gradients are minimized in the photoresist film layer itself. Thus, the recommended maximum ramp up rate is about 20° C. per minute for hot plate heating; however, this ramp up rate may be different depending on the heating method. All temperatures specified in the descriptions which follow are for the photoresist itself at the photoresist/ARC interface, and not for the hotplate under the photomask. The PAB and PEB were each carried out under ambient air atmosphere, typically at about 45% relative humidity, in the presence of a hood containing an exhaust fan. The bake time at set point temperature was about 7 minutes for the PAB and for the PEB.

Figure 7:
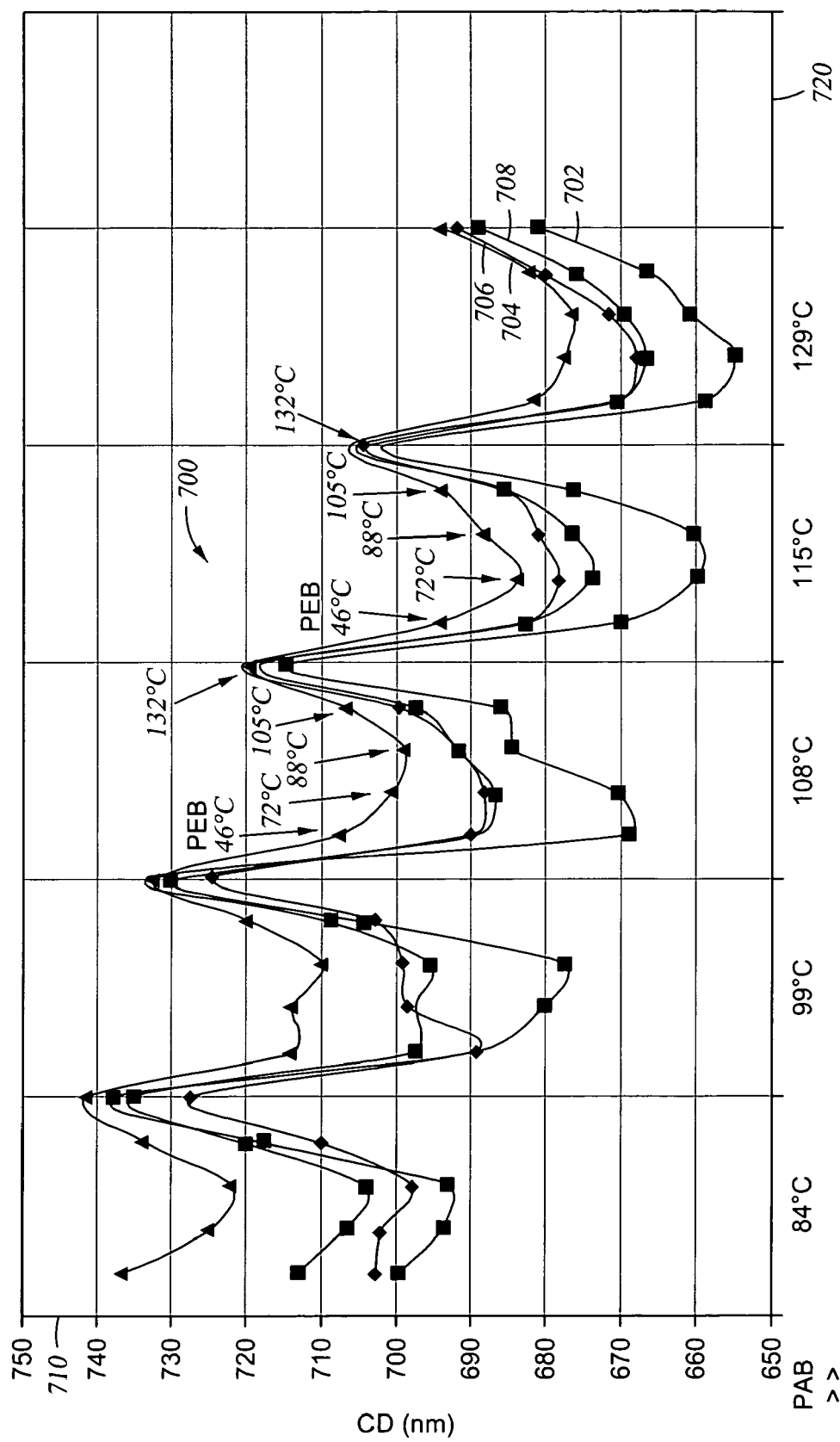
FIG. 7 shows a graph 700 which illustrates the critical dimension obtained for a patterned line in chrome as a function of the PAB and PEB temperature for a chemically amplified DUV photoresist. The DUV photoresist was DX1100 supplied by AZ-Clariant. Curves 702, 704, and 706 each represent a different photomask plate, and Curve 708 represents an average of the values for curves 702, 704, and 706. For each PAB temperature shown on axis 720, there are a series of data points representing a series of corresponding PEB temperatures. For example, with respect to a PAB temperature of 108° C., the PEB temperatures used in combination with this PAB temperature were 46° C. (beginning on the left side of the graph, i.e. the first data point), followed by 72° C., 88° C., 105° C., and 132° C., respectively. This series of data points are indicated by individual arrows pointing to the data points. The same is true with respect to each additional PAB temperature, as illustrated for a PAB of 115° C., for example.

FIG. 7 shows a graph 700 which illustrates the critical dimension, shown in nm on axis 710, for a patterned space (line) in chrome as a function of the PAB and PEB temperature for a chemically amplified DX1100 DUV photoresist. The CD was measured using an IPRO™ optical measuring tool, available from Leica Corporation with offices in Santa Clara, Calif. Curves 702, 704, and 706 each represent a different photomask plate, and Curve 708 represents an average of the values for Curves 702, 704, and 706. For each PAB temperature shown on axis 720, there are a series of data points representing a series of PEB temperatures, each of which were used in a given experiment in combination with that PAB temperature. The PEB temperature beginning on the left side of the graph (the first PEB data point), for each specified PAB temperature, was 46° C., followed by 72° C., 88° C., 105° C., and 132° C., respectively. On average, the CD decreases in size as the PAB temperature increases. At 108° C., the change in CD is minimized when the PEB temperature is held between about 72° C. and 95° C., preferably at about 88° C.

Figure 8:
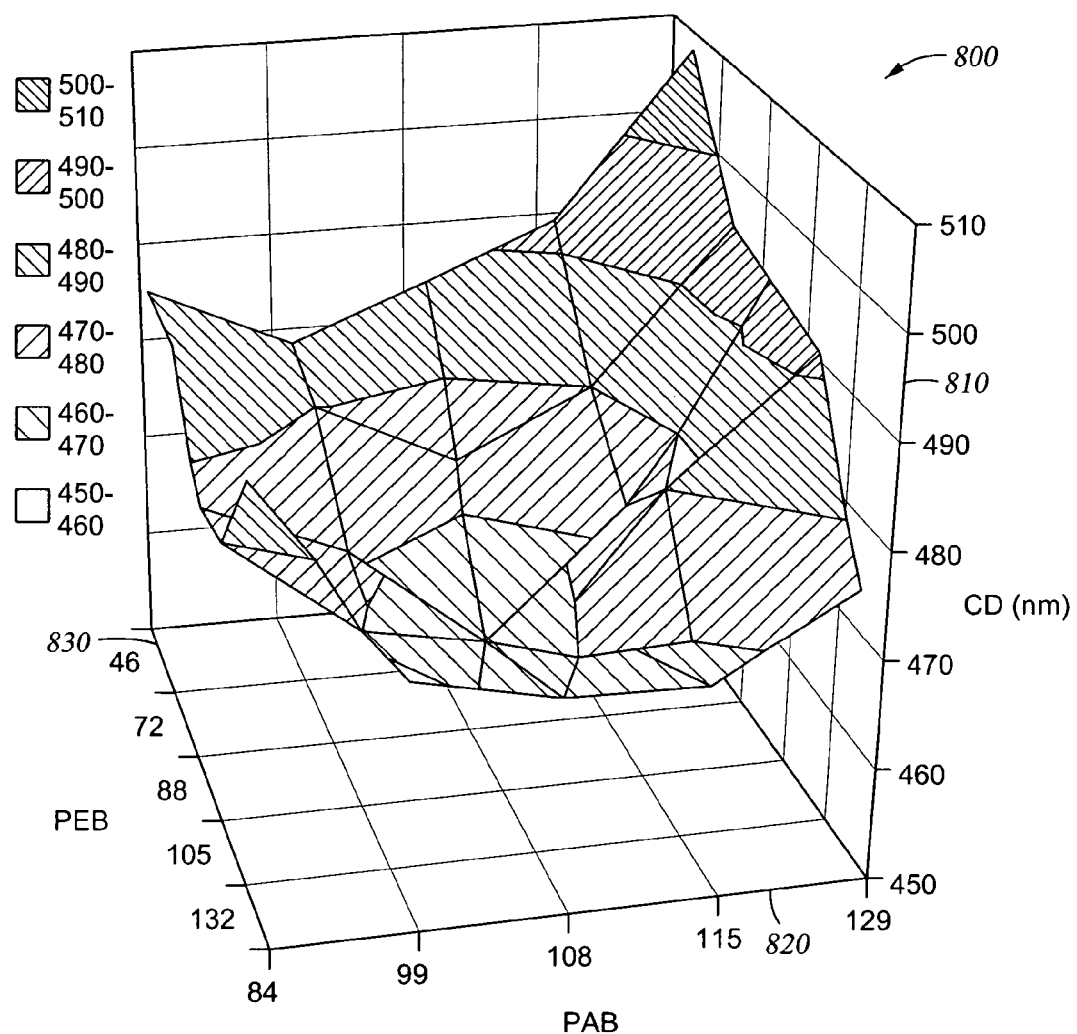
FIG. 8 is a three dimensional graph 800 which shows the critical dimension range obtained when various combinations of PAB temperature and PEB temperature are used for a DUV photoresist, where the DUV photoresist is different from that illustrated by FIG. 7.

FIG. 8 shows a three dimensional view of the affect of PAB and PEB on the critical dimension obtained for a line in chrome using the DX1100 DUV photoresist. The line (linear open space in the photoresist) critical dimension is shown in nm on axis 810, the PAB temperature is shown on axis 820, and the PEB temperature is shown on axis 830. The minimum CD line, in the range of 450–460 nm wide, is achieved when the PAB is about 106° C. and the PEB is about 78° C. The recommended process window for PAB ranges from about 105° C. to about 115° C., in combination with a process window for PEB ranging from about 70° C. to about 90° C.

The organic ARC used to prepare the example mask plates, KRF 17G, comprises PGMEA and modified acrylic polymer. (We have discovered that this particular organic ARC requires a post application bake after spin coating; the post application bake is carried out at 200±3° C. for a period of 7 minutes). The inorganic arc layer was chrome oxynitride, which was sputter deposited using techniques known in the art. The chrome-containing mask material was essentially chrome, and was also sputter deposited using techniques known in the art. The silicon oxide-containing substrate was quartz.

Figure 11B:
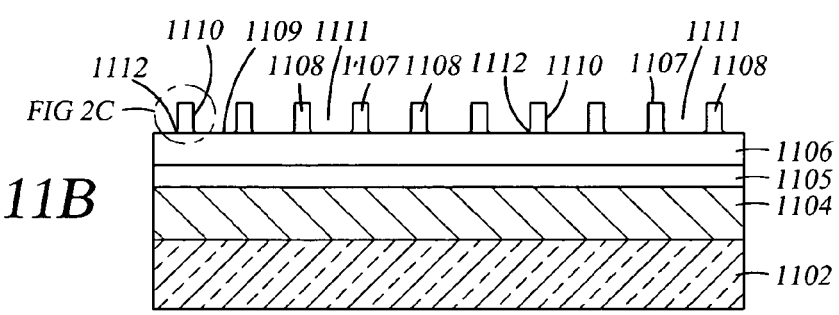

FIG. 11B shows a schematic cross-sectional view of the patterned photoresist layer 1108 (prior to transfer of the pattern through underlying organic ARC layer 1106, inorganic ARC layer 1105, and chrome-containing layer 1104), where the pattern was lines 1107 and spaces 1111, where the line width was about 0.30 μm and the spacing between lines was about 0.30 μm. The patterning was done using a direct write continuous wave laser, in particular, the 257 nm mask writing laser tool available from ETEC Systems, Inc., Hillsboro, Oreg., which was described above. The patterning method was as follows.

The 257 nm direct write continuous wave laser exposes (images) integrated circuit patterns onto an unpatterned photoresist 1108 coated on a mask blank which includes organic ARC layer 1106, inorganic ARC layer 1105, chrome-containing layer 1104, and quartz layer 1102 as described above. The mask fabrication process transformed the latent image created by the exposure of the photoresist into a permanent chrome image on the quartz substrate.

Realization of the desired control over critical dimension (CD) of the permanent chrome image depends on use of the 257 nm ALTA™ tool in combination with appropriate photoresist and ARC materials. General requirements for producing patterned resists having features in the 0.18 μm range (and smaller) are: The CD sensitivity to optical exposure dose is preferably <3.0 nm/% dose; the CD error contribution from the mask blank is less than ±2 nm within a 132-mm×132-mm area, centered on a 6-inch×6-inch×0.25-inch quartz substrate (plate). The nominal CD should be achieved at the isofocal dose.

Nominal dose for the 257 nm ALTA™ system is equivalent to isofocal dose, which is found experimentally by identifying the dose that produces the smallest deviation from target CD through focus. Exposure of the resist should occur at the isofocal exposure, which is equivalent to tape CD in the resist. The image log-slope of the 257 nm ALTA™ system is sufficiently high that underexposure to compensate for an etch undercut puts the nominal exposure dose too close to the dose-to-clear value. The dose-to-clear is the dose which is required to ensure that the entire thickness of the photoresist will be developed in the exposed areas. Typically, nominal dose is dose-to-clear ($E_0$) plus 50% for adequate process latitude. It is an advantage to have the nominal dose be equivalent to the isofocal dose, as the ultimate critical dimension will be to size. The only compensation required for variance from critical dimension is for purposes of correcting pattern etch bias, and this is done by feeding experimental size data after etch into the data handling computer of the ALTA™ Imaging system, where the features may be scaled as needed.

The latent image stability in the photoresist should be such that there is less than a 5 nm change in the CD over a 6 hour time period. Use of a PEB approximately one hour after exposure provides for adequate chemical reaction within the photoresist, while "locking" the image in place. The pattern is then developed to produce a patterned photoresist with openings to the underlying photomask substrate, as described above. When the patterned photoresist is used to transfer the pattern to the underlying chrome-containing layer 204 using a low substrate bias dry etch process, the single-edge profile (cross-sectional view of the etched chrome-containing line) should exhibit an undercut of less than 10 nm. To accomplish the desired control, the DUV photoresist should be a modern, high-contrast resist, sensitive ($\leqq 30$ mJ/cm$^2$) at 257 nm.

The substrate 1102 used for mask fabrication met the requirements shown in Table I below.

TABLE I

| Physical | Property | Condition | Quartz Mask Blank |
|---|---|---|---|
| Composition | | | 100% SiO$_2$ |
| Thermal | Expansion Coefficient ($\alpha_{50}$ –200° C. × 10$^{-7}$) | | 5 |
| Thermal | Annealing Point | | 1,120° C. |
| Optical Properties | Refractive Index | | 1.46 n$_d$ |
| Chemical Durabilities | Weight Loss | Deionized (DI) water, 100° C., 1 hour | 0.000% |
| | | 1/100N HNO$_3$, 100° C., 1 hour | 0.000% |
| | | 5% NaOH, 80° C., 1 hour | 0.17 mg/mm$^2$ |

In addition, the quartz substrate had the following physical properties: a Young modulus of 7.413 kg/mm$^2$; a sheer modulus of 3,170 kg/mm$^2$; a Poisson ratio of 0.18; a Knoop hardness of 615 kg/mm$^2$; and a Lapping hardness of 210 kg/mm$^2$. The electrical properties included a surface resistivity of $1 \times 10^{19}$ Ω/square and bulk resistivity of $1 \times 10^{18}$ Ω/square.

The antireflective properties of the organic ARC layer 1106, deposited over an inorganic arc layer, which was deposited over the chrome layer 1104) were as follows in Table II, below:

TABLE II

| Physical Property | Condition | Antireflective Properties at Organic BARC Surface Blank |
|---|---|---|
| Reflectivity | 257 nm | <0.5% |
| Film thickness | optical, n & k tool | 540 Å |
| Dry etch time (for removal) | oxygen plasma dry etch* | ~30 sec. |

The AZ DX1100P photoresist thickness should correspond to the maximum on the CD swing curve to minimize CD uniformity errors that are due to resist thickness variation. It is recommended that the maximum photoresist thickness be about 5,000 Å. The minimum photoresist thickness is about 3,000 Å to avoid pinhole defects after dry etching (because of the expected 1000Å–1500 Å resist film loss associated with the etch process). The photoresist is applied by spin coating techniques known in the art. The post application bake (PAB) of the photoresist is critical for obtaining acceptable CD uniformity performance, as described above. The resist dissolution rate depends on bake temperature variations across the mask blank, which result in dissolution rate nonuniformity. The AZ DX1100P resist shows a CD sensitivity of <1.0 nm/° C. to PAB temperature when hotplate-baked at 105° C. with a maximum variation of $\leqq 2.5°$ C. during thermal ramp up and cool-down. The specified PAB temperatures refer to the temperature of the resist on top of the photomask and not to the hotplate setpoint itself. The offset between these values depends on the equipment used and may be determined by experimentation. The effect of PAB on CD increases significantly when PAB temperatures increase considerably above about 110° C. Therefore, the PAB used was a bake at 105° C. for 7 minutes, with a bake process that results in temperature variations of less than (<) 0.5° C. at the mask blank surface at steady state. The specification for the photoresist applied over the organic ARC on the mask blank was as follows. The film thickness (swing maximum) was 4,975 Å. The uniformity over the substrate surface was ±40 Å. The mean thickness range from substrate plate to substrate plate was 100 Å. The post-apply bake (PAB) temperature variation was <0.5° C.

The 257 nm ALTA™ optical imaging system in combination with the AZ DD1100P photoresist provides 0.20 μm or better resolution and low iso/dense bias on packed pitch lines. The 257 nm ALTA™ system uses special filters designed to remove organic and inorganic basic contaminants (amines, ammonia, for example) from air in the exposure chamber, which could compromise the resist performance. Prior to exposure, the mask blanks were kept in light-tight bags and in non-outgassing boxes equipped with an integrated sealing gasket. Additionally, after imaging, the exposed mask structures (plates) were processed in a clean room area that met the environmental requirements specified in the 257 nm ALTA™ Facility Planning Manual.

After exposure (imaging) of the photoresist, the imaged resist was post exposure baked (PEB). Typically at least one hour of time is allowed after exposure prior to PEB. This permits time for chemical mobility and reaction within the chemically amplified photoresist after exposure to radiation. Additional chemical reaction takes place during the PEB, but after the PEB, the latent image is essentially fixed within the photoresist. In conformance with the correlation between PAB and PEB, the PEB was carried out at a setpoint temperature of 70° C., and time at setpoint temperature was 7 minutes. Chemically amplified DUV photoresists require a post-exposure bake to uniformly diffuse the photogenerated acid within the exposed regions, and to complete the chemical transformations within these regions that affect differential solubility. As temperature gradients have a material impact on the resultant CD uniformity, hot plate uniformity during the PEB was controlled to ±1.5° C. during ramp up and ±3° C. ramp down from a 70° C. steady state, and controlled to ±0.5° C. at setpoint in the resist, over a 132-mm×132-mm area on a 6-inch×6-inch×0.250-inch substrate.

The photoresist was developed using a spin/spray process with an AZ 300 MIF developer. This developer is a 2.38 wt % solution of tetramethyl ammonium hydroxide (TMAH). The development time was about 60 seconds. The goal is to place a large amount of developer on the plate, creating an in situ puddle process with constant replenishment. The more rapidly this step is accomplished, the more uniformity is achieved in the resultant CDs. A low spin speed, approximately 100 rpm, is optimal for initial wetting on the plate, while still permitting uniform agitation due to the rotation of the plate through the nozzle path. The rotation was maintained during developer dispense and then reduced to approximately 15 rpm throughout the puddle duration. Prior to rinsing with CO$_2$-sparged, deionized water, the remaining developer should be spun-off at approximately 1000 rpm for 5 seconds. At this time, 5 seconds of spray develop was started without altering the 1000 rpm rotational rate. Concurrent with cessation of develop dispense, $CO_2$-sparged or $CO_2$-reionized water was dispensed for approximately 30 seconds at about 300 rpm for the first 15 seconds and at 1,500 rpm for the remaining 15 seconds. Further rinse via spray-puddle was commenced, followed by a spin-dry step of approximately 90–120 seconds at 2,000–2,500 rpm.

The pattern in the photoresist was then transferred to the underlying photomask structure using a dry etch process. The substrate was etched in a high density plasma under conditions that reduced mean-to-target deviation, while still maintaining good CD uniformity. The plasma etch was performed in an inductively coupled plasma (ICP) etch tool using a three step process: descum/organic ARC (BARC) removal; chrome oxynitride (inorganic ARC)/chrome etch; and overetch.

Plasma etch systems such as the Applied Materials, Inc. CENTURA® DPS™ Plus etch system (available from Applied Materials, Inc., of Santa Clara, Calif.) may be used to provide excellent results. A plasma processing system which permits separate power application for plasma generation and for substrate biasing is commonly referred to as a Decoupled Plasma Source (DPS). Substrate biasing is used to attract ions and other high energy species from the plasma toward the substrate surface, enabling anisotropic etching. Separate application of power for plasma generation and power for substrate biasing permits separate control of the plasma density and the attractive forces (DC voltage) generated on the surface of the substrate.

A description of an apparatus including a Decoupled Plasma Source (DPS) is provided by Yan Ye et al. from the Proceedings of the Eleventh International Symposium of Plasma Processing (May 7, 1996), which was published in the Electrochemical Society Proceedings (Volume 96–12, pp. 222–233, 1996), which is hereby incorporated by reference. U.S. Pat. No. 5,753,044, issued to Hanawa et al. on May 19, 1998, contains a general description of an RF plasma reactor of the kind which permits separate power application and control for plasma generation and maintenance and for substrate biasing, by way of example and not by way of limitation.

The descum/organic ARC (BARC) removal step of the three step etch process removes any residual photoresist remaining on open areas after development, and removes the organic ARC (BARC) layer from the open areas. This is accomplished using an oxygen plasma. The oxygen plasma is created using oxygen gas as a plasma source gas, and by powering only the lower electrode (upon which the reticle plate rests). This creates both a capacitively coupled plasma and a DC bias between the plasma and the reticle. The DC bias accelerates oxygen ions from the plasma toward the photomask surface, so that the ions impinge upon the photomask surface with high kinetic energy and directionality, normal to the photomask surface. Typically the process is carried out in a process chamber at a pressure of about 3 mTorr to about 45 mTorr. In the example experiments conducted, the process chamber pressure was about 28 mTorr, and the plasma source gas of oxygen was fed into the processing chamber at a flow rate of about 90 sccm. RF power of about 125 W at a frequency of 13.56 MHZ was applied to the lower electrode (cathode). This provided a DC bias on the photomask substrate surface, while providing an oxygen plasma over the photomask surface. The temperature of the reticle plate was in the range of 25° C., with a chamber wall temperature in the range of 70° C. The descum/organic ARC (BARC) removal time was about 30 seconds. The photoresist loss due to the descum/organic ARC (BARC) removal process is about 750 Å.

The chrome oxynitride (inorganic ARC)/chrome mask layer etch was done using a plasma generated from a chlorine-oxygen-helium gas mixture. The molecular ratio of the chlorine:oxygen:helium gas mixture was about 33:117:10. The total gas flow rate was about 160 sccm. The ICP coil was powered to about 500 W at 2 MHZ to generate a high density plasma. The lower electrode was powered to about 5 W at about 13.56 MHZ, to generate a DC voltage of about −50 V on the substrate. The temperature of the reticle plate was about 25° C., while the wall temperature of the process chamber was about 70° C. The etch end point was detected by optical emission, and occurred in about 100 seconds. Typically, higher oxygen concentrations and lower pressures cause higher mean-to-target deviation and lower selectivities, while favoring better CD uniformity. One skilled in the art can optimize the process for his/her particular apparatus.

Typically the chrome layer is overetched beyond endpoint to clear residual chrome from all open regions. Generally the overetch step is an extension of the chrome etch process described above. Longer overetch steps result in higher mean-to-target deviations. Chrome spot defect densities can be affected by the length of overetch, with lower defect densities for longer overetch processes.

After completion of the chrome layer etch, a strip and clean process is performed to remove any residual contaminants from the surface of the chrome layer. The strip chemical used was sulfuric peroxide which was heated to about 75° C. and applied over the surface of the substrate plate. After treatment with sulfuric peroxide, the substrate plate is rinsed with $CO_2$-reionized, or $CO_2$-sparged deionized water. After strip, the substrate plate was subjected to an acid clean using an industry standard 70:30$H_2SO_4$/$H_2O_2$ solution, followed by another deionized water rinse. The strip step was performed on a Steag ASC 500 wet chemical processing station available from STEAG-HAMMATECH®, Santa Clara, Calif.

Figure 11C:
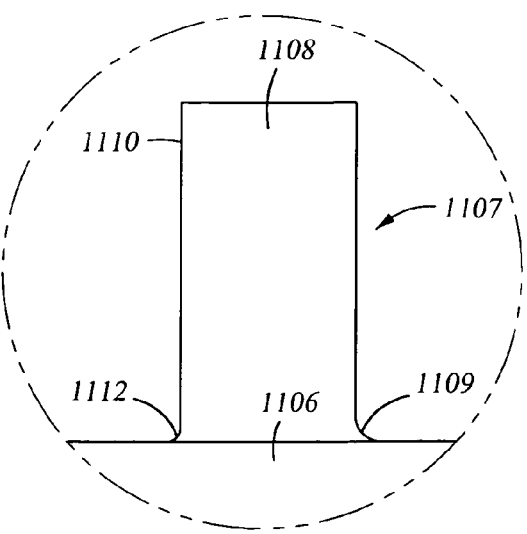

FIG. 11C shows a close-up of a typical line 1107 of a patterned photoresist layer 1108 obtained using the combination of the 257 nm ALTA™ optical imaging tool, the DX1100 DUV photoresist 1108, the KRF 17G organic ARC 1106, a chrome oxynitride inorganic ARC 1105, and a chrome mask layer 1104. The advantage in using both an organic ARC layer 1106 and an inorganic ARC layer 1105 is that resolution is improved. Using this mask fabrication method, reticles with features having a critical dimension of 200 nm have been created. For a 132-mm×132-mm (6-inch) active area, the critical dimension uniformity (CD Range/2) is typically ≦10 nm at 400 nm.

Example Two

Figure 12A:
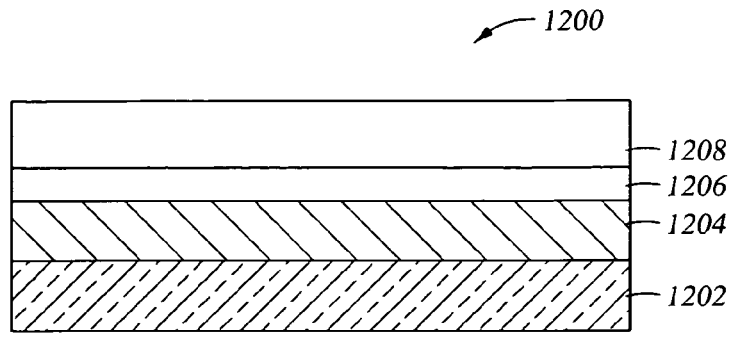
FIGS. 12A–12C illustrate a second embodiment of the present invention which illustrates a method for the direct writing continuous wave laser patterning of a chemically amplified photoresist which produces a pattern having a cross-sectional profile which enables critical dimension control during transfer of the pattern into an underlying photomask substrate.

FIG. 12A shows a starting structure 1200 used in the fabrication of a photomask (reticle). In this Example, starting structure 1200 is a stack of layers which included, from top to bottom, a 5,000 Å thick layer 1208 of the chemically amplified DUV photoresist, DX1100; a 540 Å thick layer 1206 of the organic ARC KRF 17G; a 750 Å thick layer 1204 of a mask material which is essentially chrome; and a silicon oxide-containing substrate 1202.

Figure 12B:
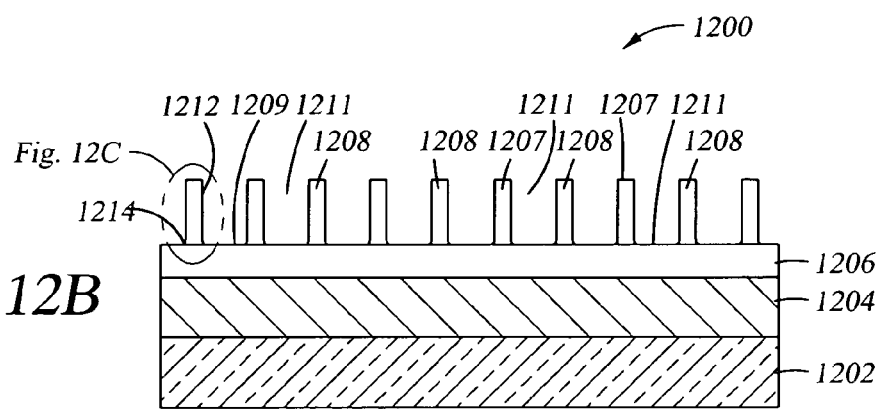

FIG. 12B shows a schematic cross-sectional view of the patterned photoresist layer 1208 (prior to transfer of the pattern through underlying organic ARC layer 1206, and chrome-containing layer 1204), where the pattern is lines 1207 and spaces 1211, where the line width is about 0.30 $\mu$m and the spacing between lines is about 0.3 μm. The patterning is done using the direct write continuous wave laser, in particular, the 257 nm mask writing laser tool available from ETEC Systems which was described above. The patterning method is as described previously for the photoresist imaging. The isofocal dosage may need to be adjusted slightly, depending on the organic ARC layer thickness, but this may be determined by minimal experimentation.

After exposure (imaging) of the photoresist, the imaged resist is post exposure baked (PEB) and developed as previously described.

The pattern in the photoresist is then transferred to the underlying photomask structure using a dry etch process using the apparatus previously described.

The descum/organic ARC (BARC) removal step is performed as described with reference to Example One.

The chrome layer etch and strip and clean process are carried out in the manner described in Example One.

Figure 12C:
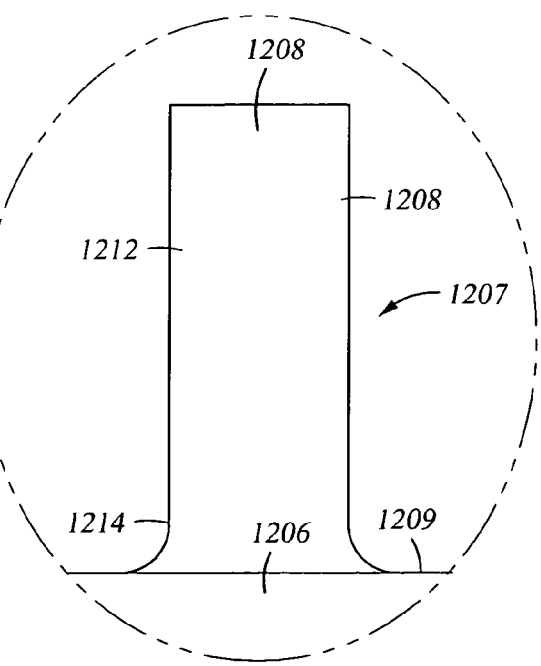

FIG. 12C shows a close-up of a typical line 1207 of a patterned photoresist layer 1208 obtained using the combination of the 257 nm ALTA™ optical imaging tool, the DX1100 DUV photoresist 1208, the KRF 17G organic ARC 1206, and a chrome mask layer 1204. Using this mask fabrication method, reticles with features having a critical dimension of 200 nm have been created. For a 132-mm×132-mm (6-inch) active area, the critical dimension uniformity (CD Range/2) is typically ≦10 nm at 400 nm.

With respect to Example One or Example Two, metrology may be carried out after patterning of the photoresist, or may be carried out after the pattern has been transferred through the chrome-containing masking layer. Conducting the metrology after patterning of the photoresist assists in providing better resolution, as etch conditions used in subsequent pattern transfer can be adjusted to provide better resolution. In instances where the photoresist pattern is defective, the significant cost of transferring a defective pattern from a patterned photoresist through several underlying layers can be avoided by conducting metrology after patterning of the photoresist.

By using an organic ARC rather than an inorganic ARC, or an organic ARC over the surface of an inorganic ARC, the chemical reaction at the base of the photoresist is eliminated, so that a foot is not produced at the base of the patterned resist. This is particularly helpful in enabling metrology after patterning of the photoresist rather than after the chrome-containing mask is patterned. As described above, this provides a substantial savings in the manufacture of reticles, as the metrology can be used to determine where in the integrated process dimensional error occurs, indicating which process step variables require adjustment to enable the production of a satisfactory reticle. Further, the metrology may also be used to determine which reticles are defective after photoresist patterning, so that these reticles may be discarded without the investment of further processing time and materials. Finally, possibly even more valuable is the improved resolution in the patterned mask itself when the pattern distortions in the photoresist are removed.

Example Three

During the development of correlations between the PAB and PEB and critical dimension sensitivity and uniformity, applicants discovered that an increased shelf life can be obtained for photoresist coated photomask/reticle substrates prior to imaging (prior to exposure to radiation for patterning). An increased shelf life for these photoresist coated substrates is particularly important, since the manufacturer for the coated substrates is typically not the same as the manufacturer who exposes the coated substrates to radiation to create an image in the photoresist.

Figure 3:
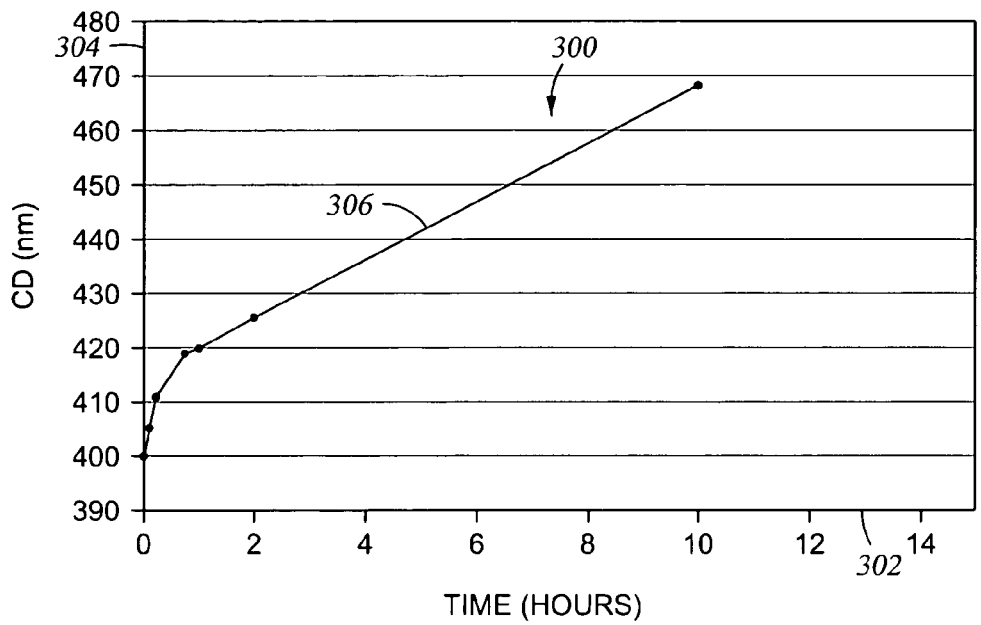
FIG. 3 is a graph 300 representing a comparative example of the affect on the critical dimension of a patterned line, in chrome, when a typical prior art photomask substrate coated with photoresist is allowed to stand for time periods up to 10 hours under ambient conditions prior to exposure to imaging radiation.

FIG. 3 shows a graph 300 of the critical dimension in nm obtained in chrome when a photoresist-coated (193 nm chemically amplified photoresist from Tokyo Ohka America, having offices in Hillsboro, Oreg.) photomask substrate was stored in ambient atmosphere in a clean room at room temperature prior to exposure to radiation for imaging. The PAB used after application of the photoresist was 90° C. for 60 seconds. Imaging was carried out using an exposure tool available from Cannon Inc. (having offices in Eugene Oreg.); this tool provides 193 nm radiation. The PEB used after exposure to radiation was 110° C. for 60 seconds. The pattern was developed using a 2.38% developer available from the photoresist manufacturer. Subsequently, the pattern in the photoresist was descummed as previously described, and was transferred to an underlying chrome layer using the dry etch process referred to with respect to FIGS. 11A through 11C. A review of the pattern critical dimension (in nm) which was obtained in the chrome layer was carried out, and the FIG. 3 graph was prepared. The data on the FIG. 3 graph shows the critical dimension in m on axis 304, while the time in hours is shown on axis 302. After only 10 hours of storage of the photoresist-coated and baked substrate prior to imaging (exposure to radiation), the CD subsequently obtained in chrome increases from 400 nm to nearly 470 nm, all other process variables held constant.

Figure 4:
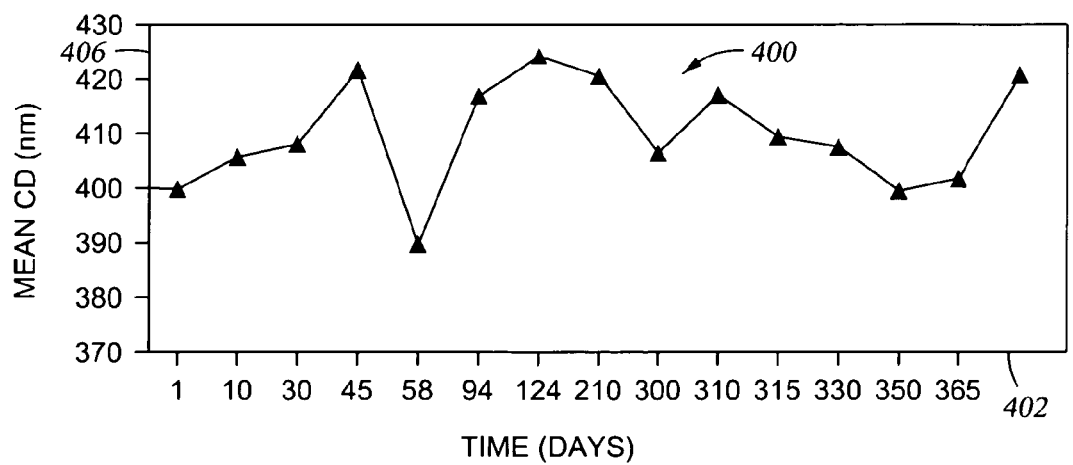
FIG. 4 is a graph 400 illustrating the stability of the critical dimension of a patterned line, in chrome, when a photomask substrate coated with photoresist, produced using the method of the present invention, is allowed to stand for time periods ranging from 1 day to greater than 365 days prior to exposure to imaging radiation.

FIG. 4 shows a graph 400 of the critical dimension in nm obtained in chrome when a DX1100 DUV photoresist was applied over the same photomask substrate as that used in the FIG. 3 specimens, with PAB at 105° C. for a time period of 9 minutes in ambient atmosphere prior to storage. After various periods of time, ranging from 1 day to greater than 365 days of storage, imaging was carried out on test specimens using the direct write 257 nm ALTA™ optical imaging tool described in detail above. After PEB at 88° C. for 7 minutes, the photoresist was developed, descummed, and the pattern in the photoresist was dry etch transferred to the underlying photomask substrate using the procedures described above. The mean CD in chrome for the photomask was measured. It was determined that the increase in mean CD was no more than 20 nm over the CD obtained when imaging was carried out immediately after photoresist coating of the photomask substrate. This improvement is attributed to the combination of the type of photoresist (DX1100 DUV) and the PAB process.

The above described preferred embodiments are not intended to limit the scope of the present invention, as one skilled in the art can, in view of the present disclosure, expand such embodiments to correspond with the subject matter of the invention claimed below.

We claim:

1. A method of increasing the shelf life of a blank photomask substrate coated with a chemically amplified photoresist, said method comprising:

selecting a chemically amplified photoresist comprising a modified phenolic polymer, and an onium salt-containing chemical amplifier;

coating a photomask substrate with said chemically amplified photoresist; and post application baking said chemically amplified photoresist on said photomask substrate at a temperature ranging between about 84° C. and about 115° C. for a time period which provides stability of said baked blank photomask substrate while exposed to ambient atmosphere conditions in a clean room at room temperature, whereby after storage of said coated photomask substrate for a period of more than 2 hours, a difference in a subsequently generated photomask critical dimension feature is less than 20 nm compared with said feature generated immediately after application of said chemically amplified photoresist on said photomask substrate.

2. A method in accordance with claim 1, wherein said chemically amplified photoresist comprises a modified phenolic polymer in combination with a chemical amplifier including an onium salt metal halide complex.

3. A method in accordance with claim 1, wherein said post application baking time period at set point ranges from greater than one minute to about 9 minutes.

4. A method of increasing the shelf life of a blank photomask substrate coated with a chemically amplified photoresist, said method comprising:
  coating a photomask substrate with said chemically amplified photoresist; and
  post application baking said chemically amplified photoresist on said photomask substrate at a temperature ranging between about 84° C. and about 115° C. for a time period sufficient to ensure that after storage of said coated photomask substrate for a period of more than 2 hours, a difference in a subsequently generated photomask critical dimension feature is less than 20 urn compared with said feature generated immediately after application of said chemically amplified photoresist on said photomask substrate.

5. A method in accordance with claim 4, wherein said post application bake time period ranges from greater than one minute to about 9 minutes.

6. A method in accordance with claim 4, wherein said temperature ranges between about 105° C. and about 115° C.

7. A method in accordance with claim 4, wherein said period of storage of said coated photomask substrate prior to exposure to patterning radiation ranges from 2 hours up to at least 365 days, and said difference in said critical dimension feature is less than about 20 nm.

8. A method in accordance with claim 4, wherein said chemically amplified photoresist comprises a modified phenolic polymer.

9. A method in accordance with claim 8, wherein said post application bake time period ranges from greater than one minute to about 9 minutes.

10. A method in accordance with claim 8, wherein said bake temperature ranges between about 105° C. and about 115° C.

11. A method in accordance with claim 8, wherein said period of storage of said coated photomask substrate prior to exposure to patterning radiation ranges from 2 hours up to at least 365 days, and said difference in critical dimension feature is less than about 20 nm.

* * * * *